United States Patent
Liu et al.

(10) Patent No.: US 12,281,411 B2
(45) Date of Patent: Apr. 22, 2025

(54) EPITAXIAL STRUCTURE

(71) Applicant: GlobalWafers Co., Ltd., Hsinchu (TW)

(72) Inventors: Jia-Zhe Liu, Hsinchu (TW); Tzu-Yao Lin, Hsinchu (TW); Ying-Ru Shih, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 304 days.

(21) Appl. No.: 16/950,916

(22) Filed: Nov. 18, 2020

(65) Prior Publication Data

US 2021/0148007 A1     May 20, 2021

(30) Foreign Application Priority Data

Nov. 18, 2019    (TW) ................... 108141762

(51) Int. Cl.
    *C30B 29/40*      (2006.01)
    *C30B 25/02*      (2006.01)
    *C30B 29/38*      (2006.01)

(52) U.S. Cl.
    CPC ............ *C30B 29/406* (2013.01); *C30B 29/38* (2013.01); *C30B 25/02* (2013.01)

(58) Field of Classification Search
    CPC ........ C30B 29/406; C30B 29/38; C30B 25/02
    See application file for complete search history.

(56) References Cited

U.S. PATENT DOCUMENTS

| | | | |
|---|---|---|---|
| 7,160,748 B2 * | 1/2007 | Ishibashi | ............ H01L 21/0254 438/45 |
| 10,014,402 B1 | 7/2018 | Chen et al. | |
| 2005/0023555 A1 | 2/2005 | Yoshida et al. | |
| 2009/0072272 A1 | 3/2009 | Suh et al. | |
| 2014/0203288 A1 | 7/2014 | Hsiung | |

(Continued)

FOREIGN PATENT DOCUMENTS

| | | | |
|---|---|---|---|
| CN | 102365745 | 2/2012 | |
| CN | 104659171 | * 5/2015 | ........... H01L 33/145 |
| TW | 201921689 | 6/2019 | |

OTHER PUBLICATIONS

Reuters et al., Polarization-Engineered Enhancement-Mode High-Electron-Mobility Transistors Using Quaternary AlInGaN Barrier Layers, 2013, Journal of Electronic Materials, 42, 5, 826-832. (Year: 2013).*

(Continued)

*Primary Examiner* — Jay C Kim
*Assistant Examiner* — Woo K Lee
(74) *Attorney, Agent, or Firm* — JCIPRNET (57) ABSTRACT

An epitaxial structure including at least a substrate, a nucleation layer, a buffer layer, a channel layer, a barrier layer, and a P-type aluminum indium gallium nitride layer is provided. The nucleation layer is formed on the substrate; the buffer layer is formed on the nucleation layer; the channel layer is formed on the buffer layer; the barrier layer is formed on the channel layer; and the P-type aluminum indium gallium nitride layer is formed on the barrier layer. The material of the P-type aluminum indium gallium nitride layer is AlInGaN with a P-type dopant, in which the contents of Al, In and Ga all change stepped-periodically or stepped-periodical-gradually in the thickness direction, and the doping concentration of the P-type dopant changes stepped-periodically or stepped-periodical-gradually in the thickness direction.

4 Claims, 7 Drawing Sheets

(56) References Cited

U.S. PATENT DOCUMENTS

2016/0284934 A1* 9/2016 Ko .......................... H01L 33/14
2017/0365701 A1* 12/2017 Kim ..................... H01L 29/205
2018/0315844 A1 11/2018 Chen et al.

OTHER PUBLICATIONS

Mojaver et al., Use of a bilayer lattice-matched AlInGaN barrier for improving the channel carrier confinement of enhancement-mode AlInGaN/GaN hetero-structure field-effect transistors, 2017, Journal of Applied Physics, 121, 244502 (Year: 2017).*

Mojaver et al., "Use of a bilayer lattice-matched AlInGaN barrier for improving the channel carrier confinement of enhancement-mode AlInGaN/GaN hetero-structure field-effect transistors", Journal of Applied Physics, 121, 244502 (2017) (Year: 2017).*

Mojaver et al. (âUse of a bilayer lattice-matched AlInGaN barrier for improving the channel carrier confinement of enhancement-mode AlInGaN/GaN hetero-structure field-effect transistorsâ, Journal of Applied Physics, 121, 244502 (2017)) (Year: 2017).*

* cited by examiner

EPITAXIAL STRUCTURE

CROSS-REFERENCE TO RELATED APPLICATION

This application claims the priority benefit of Taiwan application serial no. 108141762, filed on Nov. 18, 2019. The entirety of the above-mentioned patent application is hereby incorporated by reference herein and made a part of this specification.

BACKGROUND

Technical Field

The disclosure relates to a semiconductor structure, and in particular, to an epitaxial structure adapted for enhancement-mode (E-mode) power elements.

Description of Related Art

To turn off a traditional gallium nitride depletion-mode power element, a negative bias voltage is required to be applied to the gate, which may cause a safety concern. Therefore, a recent development of enhancement-mode (E-mode) power elements using P-type gallium nitride as the gate has been introduced. However, P-type gallium nitride has a fixed composition and is generally doped with a fixed dose of magnesium as a dopant, which may cause magnesium diffusion, poor epitaxial quality, large surface roughness, and a poor magnesium activation rate. In addition, the energy gap of gallium nitride is low, resulting in a poor gate swing when using P-type gallium nitride.

SUMMARY

The disclosure provides an epitaxial structure, which improves epitaxial characteristics and electrical properties of an element.

The epitaxial structure of the disclosure includes a substrate, a nucleation layer, a buffer layer, a channel layer, a barrier layer, and a P-type aluminum indium gallium nitride layer. The nucleation layer is formed on the substrate, the buffer layer is formed on the nucleation layer, the channel layer is formed on the buffer layer, the barrier layer is formed on the channel layer, and the P-type aluminum indium gallium nitride layer is formed on the barrier layer. The material of the P-type aluminum indium gallium nitride layer is AlInGaN with a P-type dopant, in which the contents of Al, In and Ga all change stepped-periodically or stepped-periodical-gradually in the thickness direction, and the doping concentration of the P-type dopant changes stepped-periodically or stepped-periodical-gradually in the thickness direction.

In an embodiment of the disclosure, the lattice constant of the P-type aluminum indium gallium nitride layer is 3.2±0.3 Å.

In an embodiment of the disclosure, the content of gallium of the P-type aluminum indium gallium nitride layer reduces stepped-periodically in the thickness direction, both the content of aluminum and the content of indium increase stepped-periodically in the thickness direction, and the doping concentration changes stepped-periodically in the thickness direction. A step slope of the content of aluminum is 0.1%/step to 50%/step, and a step slope of the content of indium is 0.1%/step to 20%/step. An energy gap of the P-type aluminum indium gallium nitride layer increases stepped-periodically from 3.4±1 eV to 5.03±1 eV in the thickness direction. An initial value of the content of aluminum is 0 to 50%, and an end value of the content of aluminum is 50% to 100%. An initial value of the content of indium is 0 to 50%, and an end value of the content of indium is 5% to 50%.

In an embodiment of the disclosure, the content of gallium of the P-type aluminum indium gallium nitride layer increases stepped-periodically in the thickness direction, both the content of aluminum and the content of indium reduce stepped-periodically in the thickness direction, and the doping concentration changes stepped-periodically in the thickness direction. A step slope of the content of aluminum is −0.1%/step to −50%/step, and a step slope of the content of indium is −0.1%/step to −20%/step. An energy gap of the P-type aluminum indium gallium nitride layer reduces stepped-periodically from 5.03±1 eV to 3.4±1 eV in the thickness direction. An initial value of the content of aluminum is 50% to 100%, and an end value of the content of aluminum is 0 to 50%. An initial value of the content of indium is 5% to 50%, and an end value of the content of indium is 0 to 50%.

In an embodiment of the disclosure, the content of gallium of the P-type aluminum indium gallium nitride layer reduces stepped-periodical-gradually in the thickness direction, both the content of aluminum and the content of indium increase stepped-periodical-gradually in the thickness direction, and the doping concentration changes stepped-periodical-gradually in the thickness direction. A step slope of the content of aluminum is 0.1%/step to 50%/step, and a gradual change slope of the content of aluminum is ±1%/nm to ±50%/nm. A step slope of the content of indium is 0.1%/step to 20%/step, and a gradual change slope of the content of indium is ±1%/nm to ±10%/nm. An energy gap of the P-type aluminum indium gallium nitride layer increases stepped-periodically from 3.4±1 eV to 5.03±1 eV in the thickness direction. An initial value of the content of aluminum is 0 to 50%, an end value of the content of aluminum is 50% to 100%, an initial value of the content of indium is 0 to 50%, and an end value of the content of indium is 5% to 50%.

In an embodiment of the disclosure, the doping concentration reduces stepped-periodical-gradually in the thickness direction. A step slope of the doping concentration is −1E17 $cm^{-3}$/step to −10E17 $cm^{-3}$/step, and a gradual change slope of the doping concentration is ±1E17 $cm^{-3}$/nm to ±10E17 $cm^{-3}$/nm.

In an embodiment of the disclosure, the content of gallium of the P-type aluminum indium gallium nitride layer increases stepped-periodical-gradually in the thickness direction, both the content of aluminum and the content of indium reduce stepped-periodical-gradually in the thickness direction, and the doping concentration changes stepped-periodical-gradually in the thickness direction. A step slope of the content of aluminum is −0.1%/step to −50%/step, and a gradual change slope of the content of aluminum is ±1%/nm to ±50%/nm. A step slope of the content of indium is −0.1%/step to −20%/step, and a gradual change slope of the content of indium is ±1%/nm to ±10%/nm. An energy gap of the P-type aluminum indium gallium nitride layer reduces stepped-periodically from 5.03±1 eV to 3.4±1 eV in the thickness direction. An initial value of the content of aluminum is 50% to 100%, and an end value of the content of aluminum is 0 to 50%. An initial value of the content of indium is 5% to 50%, and an end value of the content of indium is 0 to 50%.

In an embodiment of the disclosure, a step slope of the doping concentration is 1E17 cm$^{-3}$/step to 10E17 cm$^{-3}$/step, or 1E17 cm$^{-3}$/step to 5E17 cm$^{-3}$/step.

In an embodiment of the disclosure, a gradual change slope of the doping concentration is ±1E17 cm$^{-3}$/step to ±10E17 cm$^{-3}$/step.

In an embodiment of the disclosure, a surface roughness RMS of the P-type aluminum indium gallium nitride layer is between 0.1 nm and 5 nm.

Based on the above, in the disclosure, by providing a P-type aluminum indium gallium nitride layer having specific composition content changes and doping concentration changes, it is possible to solve the issue of P-type dopant diffusion in order to improve epitaxial quality and reduce the surface roughness of the epitaxial structure. In addition, the composition of the quaternary material (the P-type aluminum indium gallium nitride layer) of the disclosure may be adjusted to achieve lattice matching, which further reduces current leakage of the gate, improves the gate swing, and improves the electrical properties of the element.

In order to make the aforementioned features and advantages of the disclosure comprehensible, embodiments accompanied with drawings are described in detail below.

DESCRIPTION OF THE EMBODIMENTS

Hereinafter, some embodiments are listed and described in detail with reference to accompanying drawings, but the provided embodiments are not intended to limit the scope of the disclosure. In addition, the drawings are for illustrative purposes only and may not be drawn according to the original size. For a clearer understanding, the same elements in the following description will be described with the same symbols.

Figure 1:
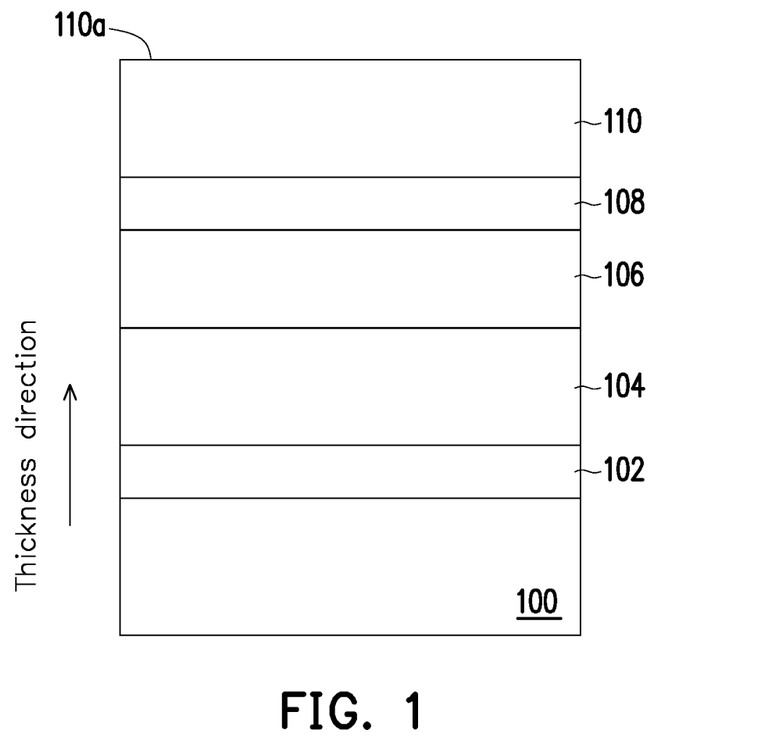
FIG. 1 is a schematic cross-sectional diagram of an epitaxial structure according to an embodiment of the disclosure.

FIG. 1 is a schematic cross-sectional diagram of an epitaxial structure according to an embodiment of the disclosure.

Referring to FIG. 1, the epitaxial structure of this embodiment includes a substrate 100, a nucleation layer 102, a buffer layer 104, a channel layer 106, a barrier layer 108, and a P-type aluminum indium gallium nitride layer 110. The nucleation layer 102 is formed on the substrate 100; the buffer layer 104 is formed on the nucleation layer 102; the channel layer 106 is formed on the buffer layer 104; the barrier layer 108 is formed on the channel layer 106; and the P-type aluminum indium gallium nitride layer 110 is formed on the barrier layer 108. In this embodiment, the material of the P-type aluminum indium gallium nitride layer 110 is AlInGaN with a P-type dopant, in which the contents of aluminum (Al), indium (In) and gallium (Ga) all change stepped-periodically or stepped-periodical-gradually in the thickness direction, and the doping concentration of the above P-type dopant changes stepped-periodically or stepped-periodical-gradually in the thickness direction. Since In, Ga, and Al in the P-type aluminum indium gallium nitride layer 110 are adjustable, results of lattice constant match may be obtained, thereby reducing crystal defects in the material. In addition, In, Ga, and Al in the P-type aluminum indium gallium nitride layer 110 may also be adjusted to obtain a high energy gap to improve the gate swing. Regarding surface improvements, since In has a surface catalytic effect which increases the surface mobility of Al, an improved surface roughness can be obtained. Changes in the composition contents and doping concentration of the P-type aluminum indium gallium nitride layer 110 are described in detail below.

Referring to FIG. 1 again, a material for the substrate 100 is, for example, silicon (Si), gallium arsenide (GaAs), gallium nitride, silicon carbide (SiC), aluminum oxide (Al$_2$O$_3$), or other suitable materials. A material for the nucleation layer 102 is, for example, aluminum indium nitride to reduce the stress of the epitaxial structure and adjust the warpage of the epitaxial structure after an epitaxial growth. An example of a material for the buffer layer 104 is doped (highly resistive) gallium nitride. The doping concentration of the buffer layer 102 is, for example, 1E17 cm$^{-3}$ to 5E18 cm$^{-3}$, or preferably 4E17 cm$^{-3}$ to 2E18 cm$^{-3}$. In an embodiment, examples of the dopant of the buffer layer 104 include iron, magnesium, carbon, etc. An example of a material for the channel layer 106 is gallium nitride. Examples of a material of the barrier layer 108 include aluminum nitride (AlN), indium nitride (InN), aluminum indium nitride (AlInN), aluminum gallium indium nitride (AlGaInN), etc.

In this embodiment, the lattice constant of the P-type aluminum indium gallium nitride layer 110 is, for example, 3.2±0.3 Å, or preferably 3.2±0.15 Å. In addition, examples of the P-type dopant of the P-type aluminum indium gallium nitride layer 110 include magnesium, aluminum, iron, zinc, or carbon, preferably magnesium. The doping concentration of the aforementioned P-type dopant is, for example, between 1E16 cm$^{-3}$ and 5E19 cm$^{-3}$. The total thickness of the P-type aluminum indium gallium nitride layer 110 is, for example, between 1 nm and 500 nm, or preferably between 1 nm and 200 nm. A roughness RMS of a surface 110a of the P-type aluminum indium gallium nitride layer 110 is, for example, between 0.1 nm and 5 nm, or preferably between 0.1 nm and 2 nm.

In addition, although the P-type aluminum indium gallium nitride layer 110 in FIG. 1 is shown as a single-layer structure, it may be considered as a structural layer composed of multiple regions, and each of the regions has fixed or gradual changes in the composition contents and the doping concentration. The number of "regions" does not necessarily represent the number of layers. Based on the process, a single-layer structure may contain more than one of the above changes. Therefore, a single layer may be composed of single or several regions, but the disclosure is not limited thereto. Accordingly, the number of layers of the P-type aluminum indium gallium nitride layer 110 may be 2 to 30 layers, or preferably 2 to 15 layers.

Figure 2:
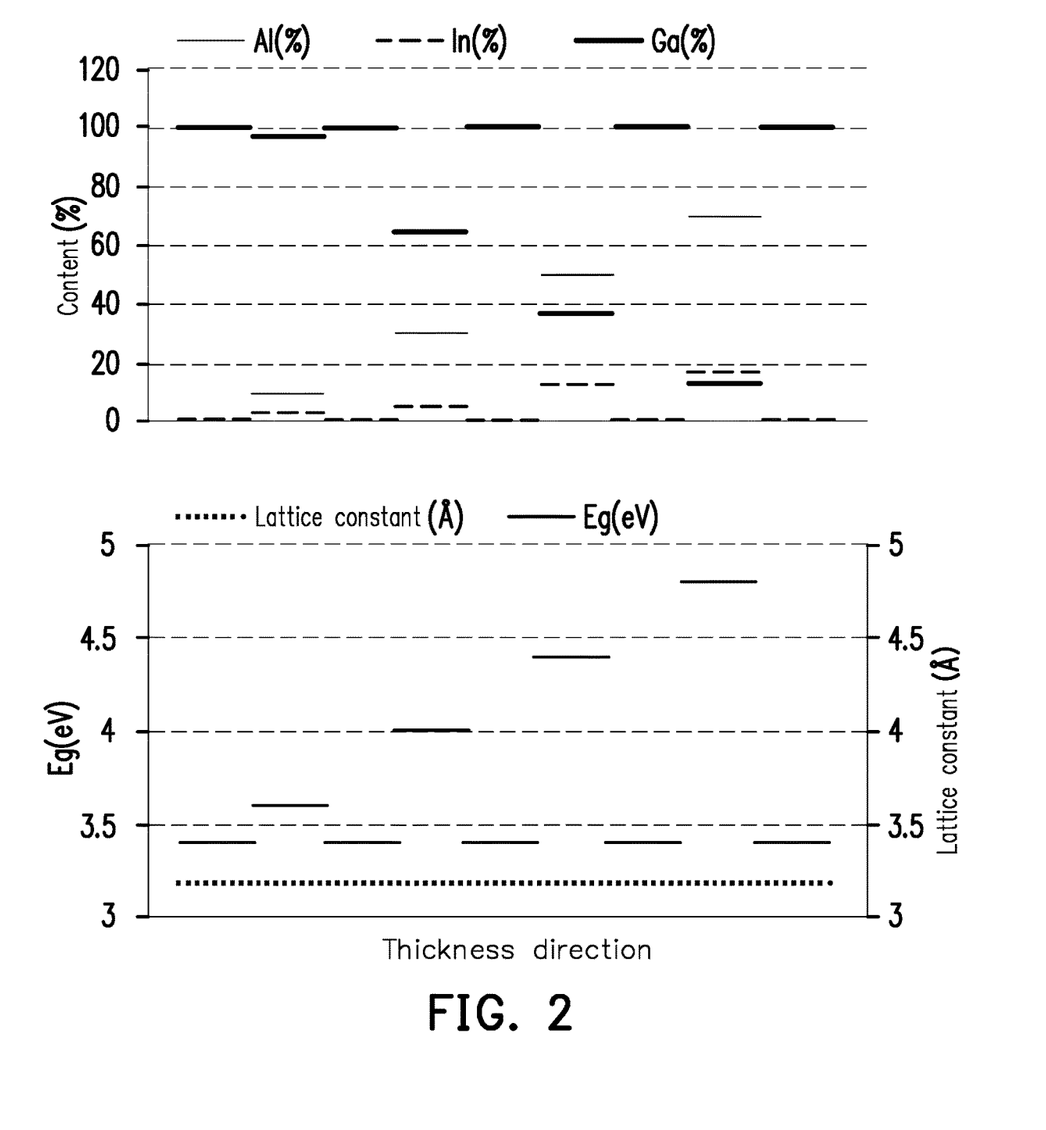
FIG. 2 is a schematic diagram of a composition content change, a lattice constant, and an energy gap change in the thickness direction of a P-type aluminum indium gallium nitride layer of the embodiment.

FIG. 2 is a schematic diagram of a composition content change, a lattice constant, and an energy gap change in a thickness direction of a P-type aluminum indium gallium nitride layer of the embodiment.

In FIG. 2, the content of gallium of the P-type aluminum indium gallium nitride layer reduces stepped-periodically in the thickness direction, and the contents of aluminum and indium both increase stepped-periodically in the thickness direction. "Reducing stepped-periodically" in the disclosure means that the values alternate between a periodical fixed content region and a continuous stepwise reducing region in the thickness direction. "Increasing stepped-periodically" means that the values alternate between a periodical fixed content region and a continuous stepwise increasing region in the thickness direction. Therefore, the energy gap of the P-type aluminum indium gallium nitride layer also shows a trend of increasing stepped-periodically in the thickness direction corresponding to the changes of the composition content. Specifically, the step slope of the content of aluminum is, for example, 0.1%/step to 50%/step, or preferably 0.1%/step to 10%/step; the step slope of the content of indium is, for example, 0.1%/step to 20%/step, or preferably 0.1%/step to 10%/step; and the energy gap of the P-type aluminum indium gallium nitride layer increases stepped-periodically in the thickness direction, for example, from 3.4±1 eV to 5.03±1 eV, or preferably from 3.4±0.5 eV to 5.03±0.5 eV. In the continuous stepwise increasing region, the initial value of the content of aluminum may be 0 to 50% or preferably 0 to 20%, and the end value of the content of aluminum may be 50% to 100%, or preferably 60% to 90%; the initial value of the content of indium may be 0 to 50%, or preferably 0 to 10%, and the end value of the content of indium may be 5% to 50%, or preferably 5% to 30%.

In addition, examples of the P-type dopant of the P-type aluminum indium gallium nitride layer in FIG. 2 include magnesium, aluminum, iron, zinc, or carbon, preferably magnesium. A magnesium doping concentration is, for example, between $1E16$ $cm^{-3}$ and $5E19$ $cm^{-3}$, or preferably between $5E17$ $cm^{-3}$ and $5E19$ $cm^{-3}$. The doping concentration may change stepped-periodically or stepped-periodical-gradually in the thickness direction, and preferably the doping concentration changes stepped-periodically in the thickness direction, as described in the following paragraphs.

Figure 3A:
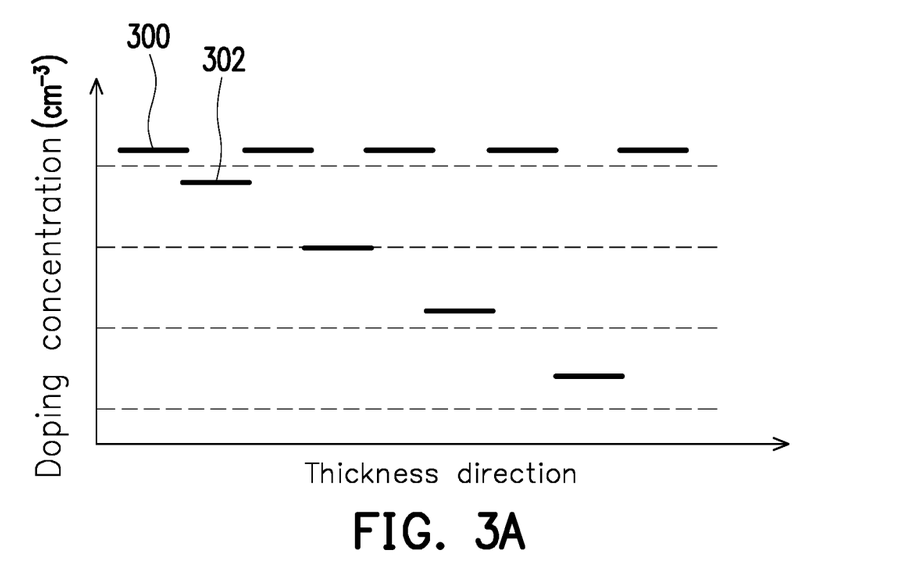
FIG. 3A is a schematic diagram of a doping concentration of the P-type aluminum indium gallium nitride layer of the embodiment reducing stepped-periodically in the thickness direction.
Figure 3B:
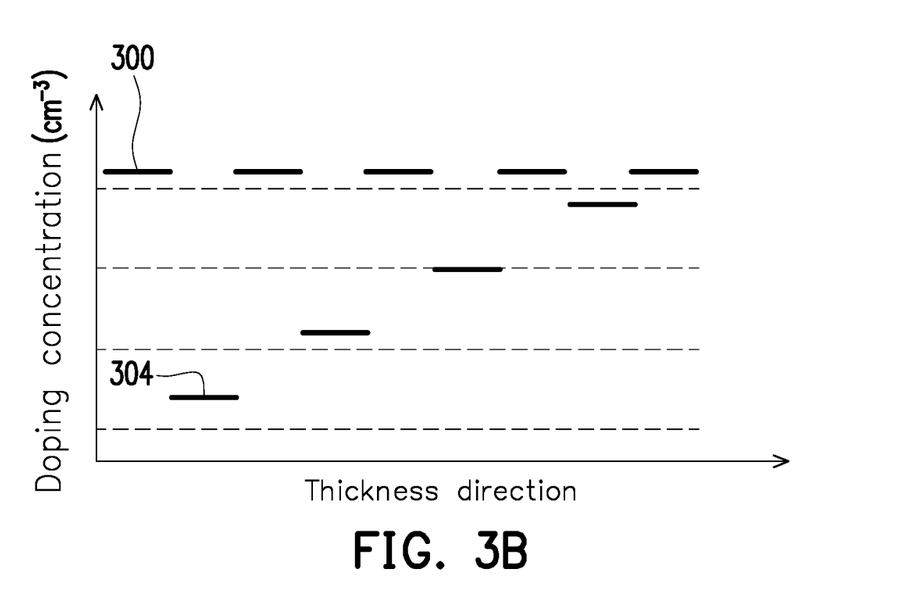
FIG. 3B is a schematic diagram of a doping concentration of the P-type aluminum indium gallium nitride layer of the embodiment increasing stepped-periodically in the thickness direction.

FIG. 3A and FIG. 3B are schematic diagrams of the doping concentration of the P-type aluminum indium gallium nitride layer of the embodiment changing stepped-periodically in the thickness direction.

In FIG. 3A, the doping concentration reduces stepped-periodically in the thickness direction; that is, the values alternate between a periodical fixed content region 300 and a continuous stepwise reducing region 302 in the thickness direction. In an embodiment, the step slope of the doping concentration is $-1E17$ $cm^{-3}$/step to $-10E17$ $cm^{-3}$/step, or preferably $-1E17$ $cm^{-3}$/step to $-5E17$ $cm^{-3}$/step.

In FIG. 3B, the doping concentration increases stepped-periodically in the thickness direction; that is, the values alternate between a periodical fixed content region 300 and a continuous stepwise increasing region 304 in the thickness direction. In an embodiment, the step slope of the doping concentration is $1E17$ $cm^{-3}$/step to $10E17$ $cm^{-3}$/step, or preferably $1E17$ $cm^{-3}$/step to $5E17$ $cm^{-3}$/step.

Figure 4:
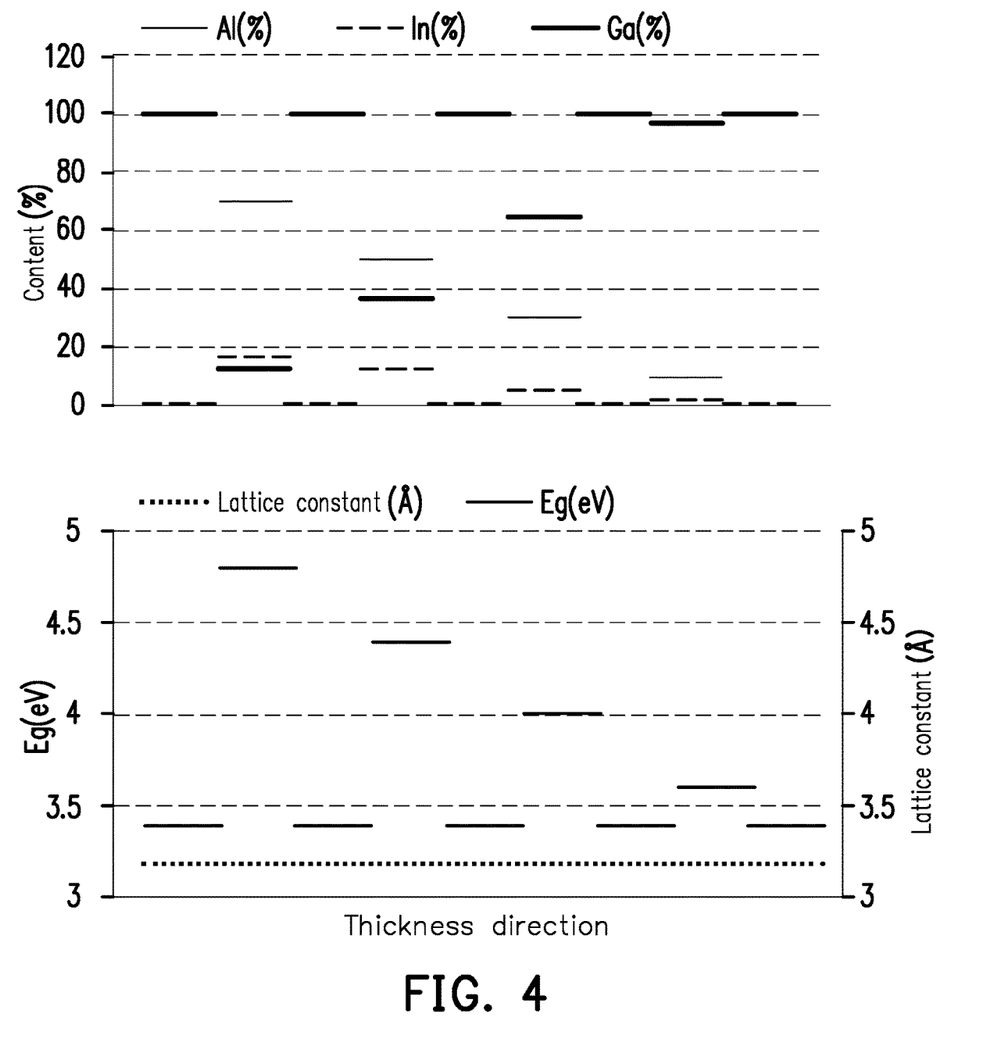
FIG. 4 is a schematic diagram of a composition content change, a lattice constant, and an energy gap change in the thickness direction of another P-type aluminum indium gallium nitride layer of the embodiment.

FIG. 4 is a schematic diagram of a composition content change, a lattice constant and an energy gap change in a thickness direction of another P-type aluminum indium gallium nitride layer of the embodiment.

In FIG. 4, the content of gallium of the P-type aluminum indium gallium nitride layer increases stepped-periodically in the thickness direction, and the content of aluminum and the content of indium both reduce stepped-periodically in the thickness direction. Therefore, the energy gap of the P-type aluminum indium gallium nitride layer also shows a trend of reducing stepped-periodically in the thickness direction corresponding to the changes of the composition content. Specifically, the step slope of the content of aluminum is, for example, −0.1%/step to −50%/step, or preferably −0.1%/step to −10%/step; the step slope of the content of indium is, for example, −0.1%/step to −20%/step, or preferably −0.1%/step to −10%/step; and the energy gap of the P-type aluminum indium gallium nitride layer reduces stepped-periodically in the thickness direction, for example, from 5.03±1 eV to 3.4±1 eV, or preferably from 5.03±0.5 eV to 3.4±0.5 eV. In the continuous stepwise reducing region, the initial value of the content of aluminum may be 50% to 100%, or preferably 60% to 90%, and the end value of the content of aluminum may be 0 to 50%, or preferably 0 to 20%; the initial value of the content of indium may be 5% to 50%, or preferably 5% to 30%, and the end value of the content of indium may be 0 to 50%, or preferably 0 to 10%.

In addition, examples of the P-type dopant of the P-type aluminum indium gallium nitride layer include magnesium, aluminum, iron, zinc, or carbon, preferably magnesium. The magnesium doping concentration is, for example, between $1E16$ $cm^{-3}$ and $5E19$ $cm^{-3}$, or preferably between $1E18$ $cm^{-3}$ and $5E19$ $cm^{-3}$. The doping concentration may change stepped-periodically in the thickness direction, preferably as shown in FIG. 3A or FIG. 3B.

Figure 5:
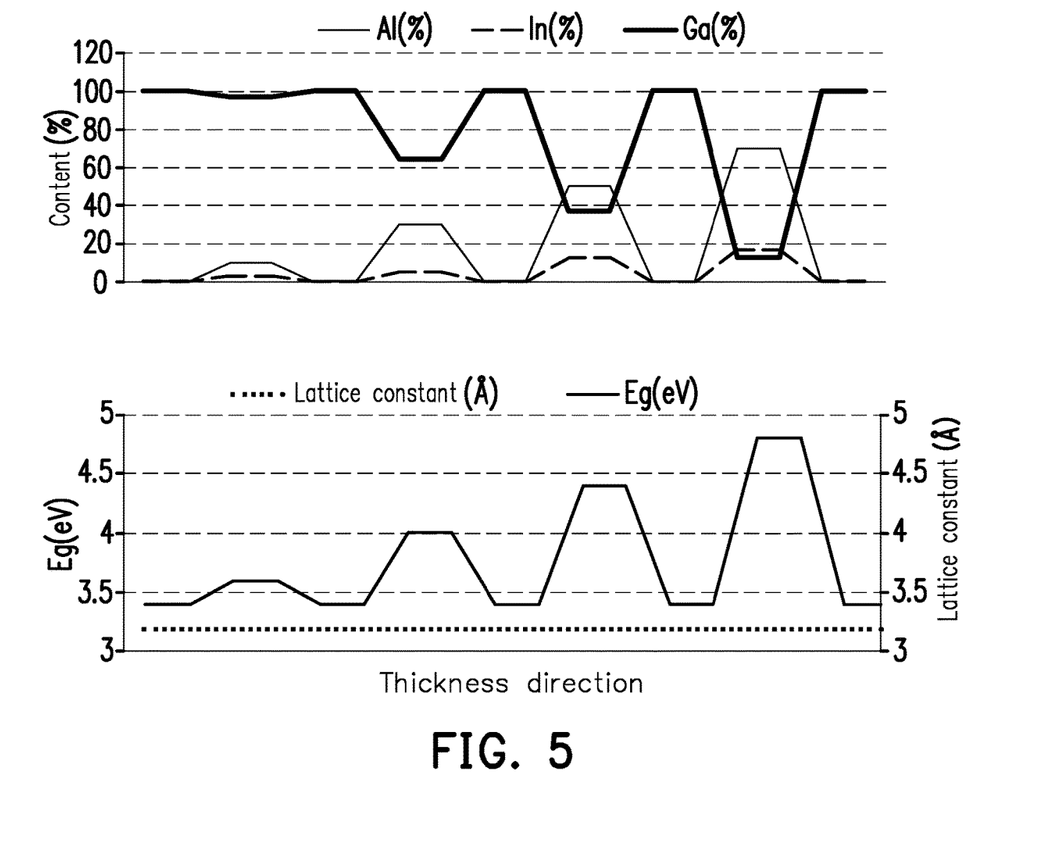
FIG. 5 is a schematic diagram of a composition content change, a lattice constant, and an energy gap change in the thickness direction of another P-type aluminum indium gallium nitride layer of the embodiment.

FIG. 5 is a schematic diagram of a composition content change, a lattice constant and an energy gap change in a thickness direction of another P-type aluminum indium gallium nitride layer of the embodiment.

In FIG. 5, the content of gallium of the P-type aluminum indium gallium nitride layer reduces stepped-periodical-gradually in the thickness direction, and the content of aluminum and the content of indium both increase stepped-periodical-gradually in the thickness direction. "Reducing stepped-periodical-gradually" in the disclosure means that the values alternate among a periodical fixed content region, a continuous stepwise reducing region, and a gradual change region between the former two regions in the thickness direction. "Increasing stepped-periodical-gradually" means that the values alternate among a periodical fixed content region, a continuous stepwise increasing region, and a gradual change region between the former two regions in the thickness direction. Therefore, the energy gap of the P-type aluminum indium gallium nitride layer also shows a trend of increasing stepped-periodical-gradually in the thickness direction corresponding to the changes of the composition content. Specifically, the step slope of the content of aluminum is, for example, 0.1%/step to 50%/step, or preferably 0.1%/step to 10%/step; the gradual change slope of the content of aluminum is, for example, ±1%/nm to ±50%/nm, or preferably ±1%/nm to ±30%/nm; the step slope of the content of indium is, for example, 0.1%/step to 20%/step, or preferably 0.1%/step to 10%/step; the gradual change slope of the content of indium is, for example, ±1%/nm to ±10%/nm, or preferably ±1%/nm to ±5%/nm; and the energy gap of the P-type aluminum indium gallium nitride layer increases stepped-periodically in the thickness direction, for example, from 3.4±1 eV to 5.03±1 eV, or preferably from 3.4±0.5 eV to 5.03±0.5 eV. In the continuous stepwise increasing region, the initial value of the content of aluminum may be 0 to 50%, or preferably 0 to 20%, and the end value of the content of aluminum may be 50% to 100%, or preferably 60% to 90%; the initial value of the content of indium may be 0 to 50%, or preferably 0% to 10%, and the end value of the content of indium may be 5% to 50%, or preferably 5% to 30%.

In addition, examples of the P-type dopant of the P-type aluminum indium gallium nitride layer in FIG. 5 include magnesium, aluminum, iron, zinc, or carbon, preferably magnesium. The magnesium doping concentration is, for example, between 1E16 $cm^{-3}$ and 5E19 $cm^{-3}$, or preferably between 5E17 $cm^{-3}$ and 5E19 $cm^{-3}$. The doping concentration may change stepped-periodically or stepped-periodical-gradually in the thickness direction, and preferably the doping concentration changes stepped-periodical-gradually in the thickness direction, as described in the following paragraphs.

Figure 6A:
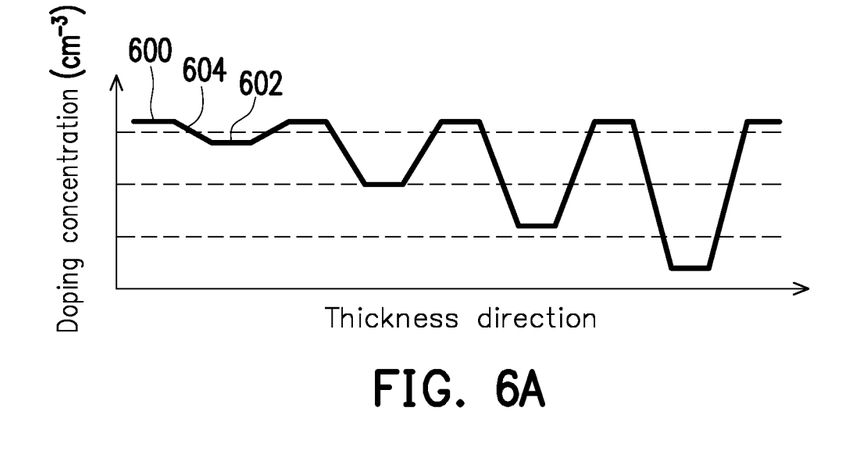
FIG. 6A is a schematic diagram of a doping concentration of the P-type aluminum indium gallium nitride layer of the embodiment reducing stepped-periodical-gradually in the thickness direction.
Figure 6B:
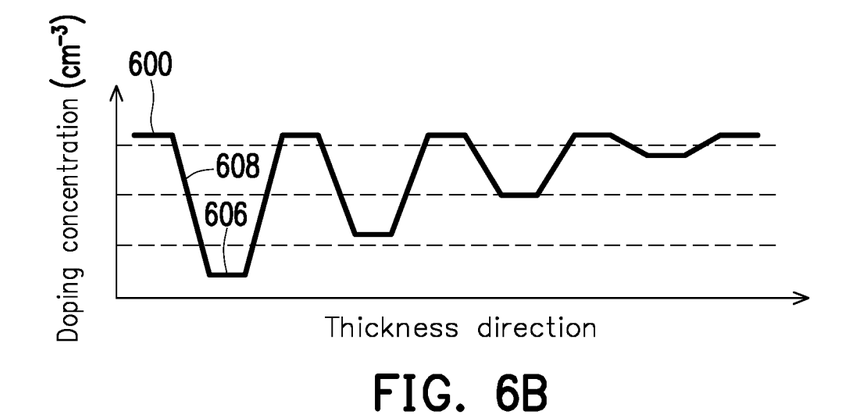
FIG. 6B is a schematic diagram of a doping concentration of the P-type aluminum indium gallium nitride layer of the embodiment increasing stepped-periodical-gradually in the thickness direction.

FIG. 6A and FIG. 6B are schematic diagrams of the doping concentration of the P-type aluminum indium gallium nitride layer of the embodiment changing stepped-periodical-gradually in the thickness direction.

In FIG. 6A, the doping concentration reduces stepped-periodical-gradually in the thickness direction; that is, the values alternate among a periodical fixed content region 600, a continuous stepwise reducing region 602, and a gradual change region 604 between the former two regions in the thickness direction. In an embodiment, the step slope of the doping concentration is −1E17 $cm^{-3}$/step to −10E17 $cm^{-3}$/step, or preferably −1E17 $cm^{-3}$/step to −5E17 $cm^{-3}$/step; the gradual change slope of the doping concentration is ±1E17 $cm^{-3}$/nm to ±10E17 $cm^{-3}$/nm, or preferably ±1E17 $cm^{-3}$/nm to ±5E17 $cm^{-3}$/nm. Moreover, in an exemplary embodiment, the composition content changes of FIG. 5 and the doping concentration changes of FIG. 6A, if applied together, effectively reduce the defect density and surface roughness of the P-type aluminum indium gallium nitride layer and further have the following effects. For example, when the content of aluminum increases stepped-periodical-gradually in the thickness direction, a Schottky contact may be formed between the gate metal (not shown) and the P-type aluminum indium gallium nitride layer, thereby reducing current leakage of the gate of the elements and improving the gate swing. When the doping concentration (such as the doping concentration of magnesium) reduces stepped-periodical-gradually in the thickness direction, a Schottky contact may be formed between the gate metal (not shown) and the P-type aluminum indium gallium nitride layer, thereby reducing current leakage of the gate of the elements and improving the gate swing. This way, a high hole concentration is also achieved, and electrical issues caused by a P-type dopant diffusion (such as a magnesium diffusion) into a two-dimensional electron gas (2DEG) are reduced, thereby achieving an improved structural performance.

In FIG. 6B, the doping concentration increases stepped-periodical-gradually in the thickness direction; that is, the values alternate among a periodical fixed content region 600, a continuous stepwise increasing region 606, and a gradual change region 608 between the former two regions in the thickness direction. In an embodiment, the step slope of the doping concentration is 1E17 $cm^{-3}$/step to 10E17 $cm^{-3}$/step, or preferably 1E17 $cm^{-3}$/step to 5E17 $cm^{-3}$/step; the gradual change slope of the doping concentration is ±1E17 $cm^{-3}$/nm to ±10E17 $cm^{-3}$/nm, or preferably ±1E17 $cm^{-3}$/nm to ±5E17 $cm^{-3}$/nm.

Figure 7:
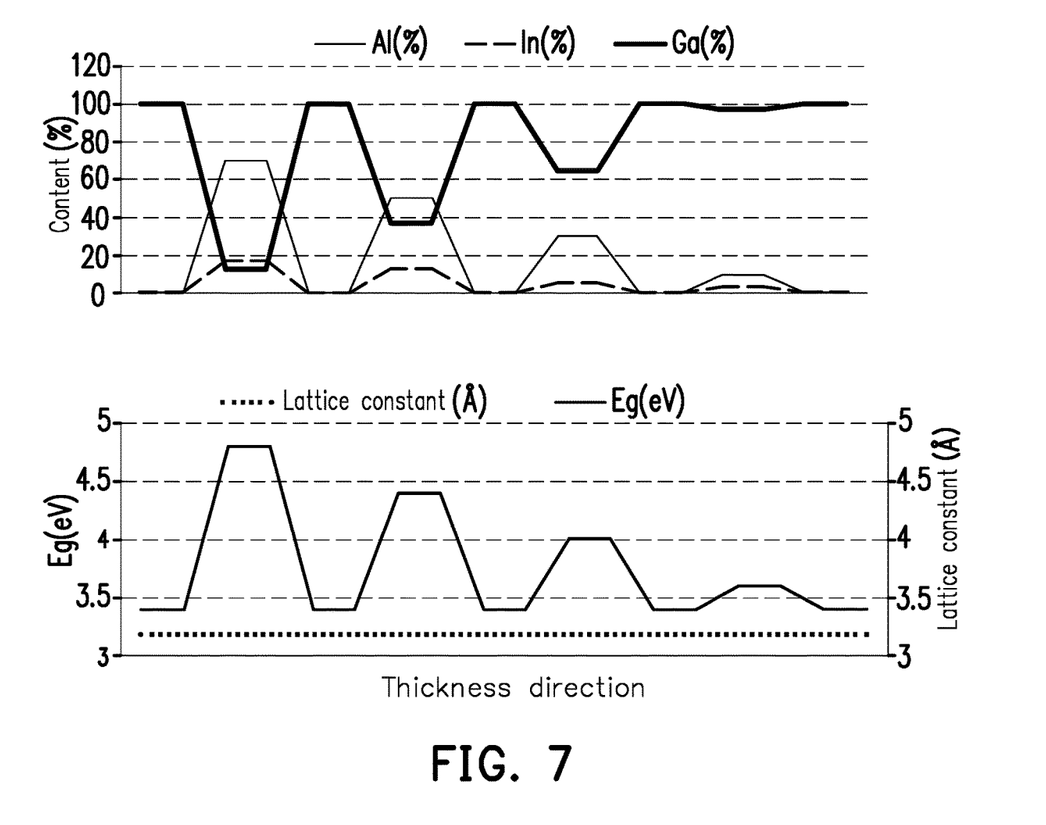
FIG. 7 is a schematic diagram of a composition content change, a lattice constant, and an energy gap change in a thickness direction of another P-type aluminum indium gallium nitride layer of the embodiment.

FIG. 7 is a schematic diagram of a composition content change, a lattice constant and an energy gap change in a thickness direction of another P-type aluminum indium gallium nitride layer of the embodiment.

Referring to FIG. 7, the content of gallium of the P-type aluminum indium gallium nitride layer increases stepped-periodical-gradually in the thickness direction, and the content of aluminum and the content of indium both reduce stepped-periodical-gradually in the thickness direction. Therefore, the energy gap of the P-type aluminum indium gallium nitride layer also shows a trend of reducing stepped-periodical-gradually in the thickness direction corresponding to the changes of the composition content. Specifically, the step slope of the content of aluminum is, for example, −0.1%/step to −50%/step, or preferably −0.1%/step to −10%/step; the gradual change slope of the content of aluminum is, for example, ±1%/nm to ±50%/nm, or preferably ±1%/nm to ±30%/nm; the step slope of the content of indium is, for example, −0.1%/step to −20%/step, or preferably −0.1%/step to −10%/step; the gradual change slope of the content of indium is, for example, ±1%/nm to ±10%/nm, or preferably ±1%/nm to ±5%/nm; and the energy gap of the P-type aluminum indium gallium nitride layer reduces stepped-periodically in the thickness direction, for example, from 5.03±1 eV to 3.4±1 eV, or preferably from 5.03±0.5 eV to 3.4±0.5 eV. In the continuous stepwise reducing region, the initial value of the content of aluminum may be 50% to 100%, or preferably 60% to 90%, and the end value of the content of aluminum may be 0 to 50%, or preferably 0 to 20%; the initial value of the content of indium may be 5% to 50%, or preferably 5% to 30%, and the end value of the content of indium may be 0 to 50%, or preferably Oto 10%.

In addition, examples of the P-type dopant of the P-type aluminum indium gallium nitride layer in FIG. 7 include magnesium, aluminum, iron, zinc, or carbon, preferably magnesium. The magnesium doping concentration is, for example, between 1E16 $cm^{-3}$ and 5E19 $cm^{-3}$, or preferably between 1E18 $cm^{-3}$ and 5E19 $cm^{-3}$. The doping concentration may change stepped-periodically or stepped-periodical-gradually in the thickness direction, and preferably the doping concentration changes stepped-periodical-gradually in the thickness direction, as shown in FIG. 6A or FIG. 6B.

In summary of the above, in the disclosure, by configuring a P-type aluminum indium gallium nitride layer to have specific composition content changes and doping concentration changes, it is possible to reduce the defect density and surface roughness thereof and reduce the probability of a P-type dopant diffusion to improve the epitaxial quality and enhance lattice matching, thereby reducing current leakage of the gate and improving the gate swing.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. An epitaxial structure comprising:
a substrate;
a nucleation layer formed on the substrate;
a buffer layer formed on the nucleation layer;
a channel layer formed on the buffer layer;
a barrier layer formed on the channel layer; and
a P-type aluminum indium gallium nitride layer formed on the barrier layer, wherein a material of the P-type aluminum indium gallium nitride layer is AlInGaN with a P-type dopant, the P-type dopant is magnesium, iron, zinc, or carbon, wherein
a content of aluminum in the P-type aluminum indium gallium nitride layer includes alternating changes among a first minimum content, a first increasing content, a first discontinuous stepwise increasing content, and a first reducing content in a thickness direction,
a content of indium in the P-type aluminum indium gallium nitride layer includes alternating changes among a second minimum content, a second increasing content, a second discontinuous stepwise increasing content, and a second reducing content in the thickness direction, the first discontinuous stepwise increasing content in the content of aluminum and the second discontinuous stepwise increasing content in the content of indium simultaneously increase in the thickness direction,
a content of gallium in the P-type aluminum indium gallium nitride layer includes alternating changes among a third maximum content, a third reducing content, a third discontinuous stepwise reducing content, and a third increasing content in the thickness direction,
a doping concentration of the P-type dopant in the P-type aluminum indium gallium nitride layer includes alternating changes among a maximum concentration, a reducing concentration, a discontinuous stepwise reducing concentration, and an increasing concentration in the thickness direction, and
an initial value of the first discontinuous stepwise increasing content in the content of aluminum is more than 0% and less than or equal to 50%, an end value of the first discontinuous stepwise increasing content in the content of aluminum is 50% to 100%, an initial value of the second discontinuous stepwise increasing content in the content of indium is more than 0% and less than or equal to 50%, and an end value of the second discontinuous stepwise increasing content in the content of indium is 5% to 50%.

2. The epitaxial structure according to claim 1, wherein a lattice constant of the P-type aluminum indium gallium nitride layer is 3.2-0.3 Å.

3. The epitaxial structure according to claim 1, wherein a step slope of the first discontinuous stepwise increasing content in the content of aluminum is 0.1%/step to 50%/step, a slope of the first increasing content in the content of aluminum is 1%/nm to 50%/nm, and a slope of the first reducing content in the content of aluminum is -1%/nm to -50%/nm, a step slope of the second discontinuous stepwise increasing content in the content of indium is 0.1%/step to 20%/step, a slope of the second increasing content in the content of indium is 1%/nm to 10%/nm, and a slope of the second reducing content in the content of indium is -1%/nm to -10%/nm, and
an energy gap of the P-type aluminum indium gallium nitride layer includes alternating changes among a minimum value, an increasing value, a discontinuous stepwise increasing value, and a reducing value in the thickness direction, wherein the discontinuous stepwise increasing value simultaneously increases with the first discontinuous stepwise increasing content in the content of aluminum and the second discontinuous stepwise increasing content in the content of indium, and the discontinuous stepwise increasing value of the energy gap of the P-type aluminum indium gallium nitride layer changes from 3.4±1 eV to 5.03=1 eV in the thickness direction.

4. The epitaxial structure according to claim 3, wherein a step slope of the discontinuous stepwise reducing concentration in the doping concentration is -1E17 $cm^{-3}$/step to -10E17 $cm^{-3}$/step, and a slope of the reducing concentration in the doping concentration is -1E17 $cm^{-3}$/nm to -10E17 $cm^{-3}$/nm, and a slope of the increasing concentration in the doping concentration is 1E17 $cm^{-3}$/nm to 10E17 $cm^{-3}$/nm.

* * * * *